United States Patent [19]

Yoshimoto et al.

[11] Patent Number: 5,716,753
[45] Date of Patent: Feb. 10, 1998

[54] POSITIVE-WORKING QUINONE DIAZIDE RESIST COMPOSITION CONTAINING ORGANIC PHOSPHORIC COMPOUND AND AN AMINE AND PROCESS FOR THE FORMATION OF FINE PATTERN USING SAME

[75] Inventors: Hiroshi Yoshimoto; Nobuo Suzuki; Wataru Ishii; Shinya Katoh; Hiroaki Matsuura, all of Shizuoka, Japan

[73] Assignees: Fuji Photo Film Co., Ltd., Kanagawa; Fuji Film Olin Co., Ltd., Tokyo, both of Japan

[21] Appl. No.: 675,056

[22] Filed: Jul. 3, 1996

[30] Foreign Application Priority Data

Jul. 3, 1995 [JP] Japan .................... 7-167530

[51] Int. Cl.$^6$ .................... G03F 7/023
[52] U.S. Cl. .................... 430/191; 430/165; 430/192; 430/313; 430/318
[58] Field of Search .................... 430/191, 192, 430/193, 313, 323, 318, 165

[56] References Cited

U.S. PATENT DOCUMENTS 5,338,643  8/1994  Kanazawa et al. .................... 430/191

FOREIGN PATENT DOCUMENTS

| 63-237053 | 10/1988 | Japan . |
| 284654 | 3/1990 | Japan . |
| 2141754 | 5/1990 | Japan . |
| 5181281 | 7/1993 | Japan . |
| 736180 | 2/1995 | Japan . |

*Primary Examiner*—Christopher G. Young
*Attorney, Agent, or Firm*—Sughrue, Mion, Zinn, Macpeak & Seas, PLLC

[57] ABSTRACT

A positive-working photosensitive composition comprises:
  (1) an alkali-soluble resin;
  (2) a quinonediazide compound;
  (3) an organic phosphoric compound; and
  (4) at least one of a phenylenediamine compound and a derivative thereof, 2-amino-1-phenylethanol, N-phenyldiethanolamine, N-phenylethanolamine, N-ethyldiethanolamine, and N-ethylethanolamine. The resist composition exhibits so higher an adhesion to a substrate than ever as to provide an enhanced accuracy in processing during etching, enabling subsequent faithful transfer of a finer pattern to the substrate.

3 Claims, 1 Drawing Sheet

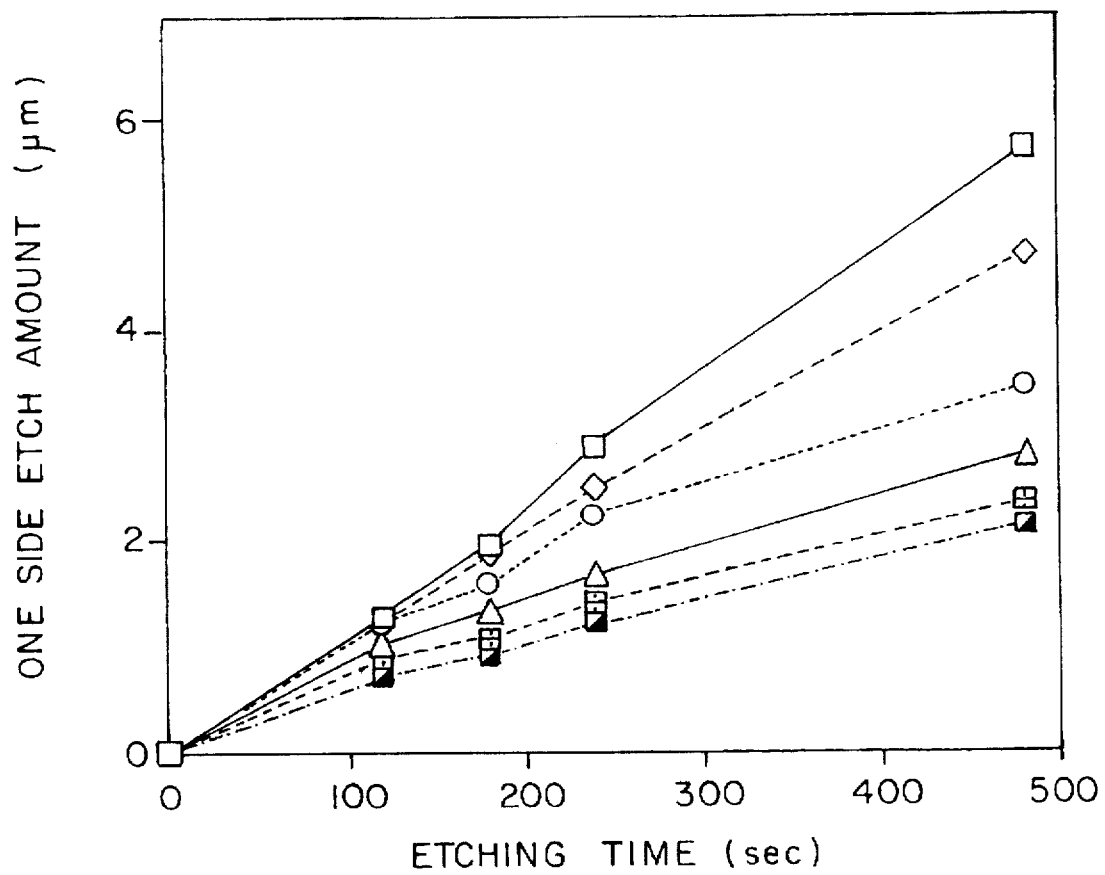

POSITIVE-WORKING QUINONE DIAZIDE RESIST COMPOSITION CONTAINING ORGANIC PHOSPHORIC COMPOUND AND AN AMINE AND PROCESS FOR THE FORMATION OF FINE PATTERN USING SAME

FIELD OF THE INVENTION

The present invention relates to a novel positive-working photosensitive composition (hereinafter referred to as "positive-working resist composition"). More particularly, the present invention relates to a positive-working photosensitive composition (positive-working resist composition) adapted for the preparation of electronic parts such as semiconductor device and liquid crystal device, which comprises as main components an alkali-soluble resin, a quinonediazide compound and a specific compound having an effect of enhancing the process accuracy at etching. Further, the present invention relates to a positive-working photosensitive composition which is so excellent in resolution, sensitivity, developability and preservability, particularly in adhesion to a substrate, as to be suitable for fine processing. The present invention also relates to a process for the formation of a pattern using such a positive-working photosensitive composition.

The resist composition according to the present invention finds major application in the photofabrication process in the production of large scale integrated circuit devices such as LSI or liquid crystal display circuits. In this process, many substrates such as various semiconductor wafers and glass or ceramic substrates having a metal film or electrically-conductive film formed thereon are used. A resist composition is applied to the surface of these substrates by a rotary coating method, roller coating method or the like to form a film thereon. The film thus formed is then imagewise irradiated with active rays to form a desired circuit pattern thereon. Thereafter, with this circuit pattern as a mask, the metal film or electrically-conductive film on these substrates is subjected to etching. The circuit pattern is then removed to obtain a desired fine circuit device pattern of metal film.

BACKGROUND OF THE INVENTION

In order to form such a fine pattern, a resist composition comprising as main components two components, i.e., alkali-soluble novolak resin classified as phenolic resin and photosensitive material comprising a naphthoquinonediazide group as a photosensitive group is normally used. Such a composition can be used to form an image pattern having a wide range of dimension of from a sub half micron range (e.g., 0.3 µm) to a significantly large value (e.g., several scores of micrometers to several hundreds of micrometers), making it possible to finely work various substrates.

This type of a resist composition is positive-working. It finds wider application than resist compositions requiring solvent development such as rubber negative resist. This is because the positive resist composition has a better resolution, acid resistance and etching resistance than the conventional negative-working rubber resist composition and undergoes solvent-free development that causes less trouble with disposal of waste fluid. One of the biggest differences between the two types of resist compositions is that the positive-working resist composition shows a remarkably small change in the image dimension due to swelling during development and thus is relatively easy to control in dimension.

In the field of an integrally-circuited semiconductor, the line width of the circuit is reduced with an increase of the degree of integration. At the present, the line width is reduced to half micron from sub micron.

Also in the field of liquid crystal display device, with the development of technology of TFT, color STN, etc., there is a tendency that the line width becomes finer. For example, the conventional devices comprising TN or STN liquid crystal have been designed to have a line width of about 200 µm. The modern version of these devices can be designed to have a line width of 100 µm or less at minimum. Further, TFT display devices which exhibit a good response or image quality can be designed to have a line width of several micrometers at minimum.

Photofabrication is one of important techniques for finely processing these substrates. The subsequent process for processing the metal film or electrically-conductive film on these substrates is important, too.

Examples of such a working process include dry etching process free from etchant and wet etching process using a specific etchant. The two etching processes may be used singly or in combination.

In order to obtain designed device properties, it is necessary to control the line width. There are two important points in the control over the line width, i.e., control over the line width of resist pattern during the image formation and the dimensional control during etching.

Particularly in the processing of a high resolution resist pattern involved in the reduction of the line width, the resolution as well as the adhesion of the resist composition to the substrate are important factors of the enhancement of the accuracy in processing.

Further, as the line width becomes finer, the requirement for adhesion between the extremely fine pattern formed by the organic resist and the surface of the metallic substrate is increased.

Particularly in the wet etching process, the adhesion between the pattern and the substrate has a great effect on the accuracy in the processing of the substrate.

In order to enhance the adhesion between the pattern and the substrate for the purpose of enhancing the accuracy in processing with a positive-working resist composition, a technique has heretofore been normally employed which comprises pretreatment for exposing the substrate to a vapor of a silicon compound called HMDS (hexamethyl disilazalane) to change the properties of the surface of the substrate.

However, it has been well known that this process requires the selectivity of substrate and thus strongly depends on the kind of the substrate. Thus, this process do not satisfy the requirements fully in the field of semiconductor.

In order to make up for the deficiency in the foregoing process, the optimum formulation of the components of the resist has been studied. At the same time, techniques of additives for enhancing the adhesion to the substrate have been developed. Thus, the adhesion to the substrate has been improved.

Examples of substrates to be incorporated in liquid crystal devices include ITO, Ta, Mo, Cr, SiNx and p-Si. Thus, in the field of liquid crystal device, new substrate metal materials have been employed, and resists having a good adhesion to many kinds of substrates have been desired.

With the development of a new technique of color STN or TFT display devices, e.g., switching from monochromatic to color and from small-size to large size and development of fast-response devices which can give a sharper image that is more perceptible, the ITO film, which has been used as a transparent electrically-conductive film for a long time, tends to be converted to that having lower resistivity, i.e., greater thickness. In order to cope with the process for etching such an ITO film having a great thickness, a method has been employed which comprises effecting processing over a period of time longer than the conventional over-etching processing time to enhance the in-plane uniformity of etched dimension. It has therefore been made clear that even with the adhesion level which can be applied to the conventional designed dimension without any problem, etching of a pattern having a finer dimension results in an increase of the side etch amount, causing the peeling of a fine resist pattern and hence making it impossible to obtain a finely-etched pattern having a desired size and meet the requirements sufficiently. Thus, a resist having a high level adhesion such that the side etch amount is less.

As mentioned above, many studies have been made of the enhancement of the adhesion of the resist to the substrate during etching for the purpose of enhancing the accuracy in processing accompanied by the reduction of line width.

For example, JP-A-2-84654 (The term "JP-A" as used herein means an "unexamined published Japanese patent application") to Kobayashi, Matsuda et al. discloses that a binary positive-working resist composition comprising a quinoneazide and a phenolic resin can enhance its adhesion to various substrates such as ITO substrate when provided with at least one compound selected from the group consisting of urea compound, thiourea compound and arylamine compound.

Further, JP-A-5-181281 to Yoshimoto et al. discloses that a novolak-naphthoquinonediazide positive-working resist composition and a negative-working resist composition comprising a novolak-melamine crosslinking agent and a photo acid generator can enhance their adhesion to a substrate when provided with an organic phosphoric compound.

Although the techniques of JP-A-2-84654 and JP-A-5-181281 give significantly good properties depending on the kind of the substrate used, a sufficient adhesion cannot be provided or a sufficient effect cannot be exerted depending on some kinds of substrates. Thus, these techniques have the selectivity of substrate. Further, these techniques are disadvantageous in that they cannot always exert a good effect depending on some kinds of substrates in the wet etching process. Thus, these techniques leave something to be desired from the standpoint of the foregoing high adhesion at over-etching.

Further, JP-A-2-141754 to Adachi et al. discloses that a specific thiazole compound (containing a halogen atom, an alkyl group, an alkoxy group, an amino group, a nitro group, etc. as substituents) can be incorporated in a resist matrix made of a quinonediazide and a novolak resin to prepare a lithographic printing composition which can serves as either a negative-working composition or a positive-working composition.

Still further, JP-A-7-36180 discloses that a phosphite ester compound, a phosphorous-containing compound, can be incorporated in a photosensitive composition comprising an alkali-soluble resin and a quinonediazide photosensitive material to prepare a positive-working resist composition having good preservability at a resist solution state.

Moreover, JP-A-63-237053 discloses that an alkylamine, an arylamine, an aralkylamine and a nitrogen-containing heterocyclic compound can be incorporated in a photosensitive composition comprising an alkali-soluble resin and a quinonediazide photosensitive material to prepare a resist composition having good preservability in the form of a resist solution.

However, these lithographic printing compositions containing a specific thiazole compound and resist compositions having a good storage stability leaves something to be desired in adhesion.

SUMMARY OF THE INVENTION

It is therefore an object of the present invention to provide a resist composition which exhibits high adhesion to a substrate and an improved process accuracy in etching, enabling subsequent faithful transfer of a finer pattern to the substrate, as compared with the conventional resist composition.

It is another object of the present invention to provide an etching process for the formation of a fine pattern using such a resist composition.

These and other objects of the present invention will become more apparent from the following detailed description and examples.

The inventors made extensive studies of these difficulties. As a result, it was found that a positive-working resist composition comprising as main components two components, i.e., an alkali-soluble resin and a photosensitive compound having a naphthoquinonediazide group as a photosensitive group in its molecule, in which a certain kind of an organic phosphorous compound and a specific amine compound as adhesion aids are incorporated in combination, can exhibit a remarkably enhanced adhesion to a substrate. Thus, the present invention has been worked out.

The objects of the present invention are accomplished by the following constitutions.

(I) A positive-working photosensitive composition, comprising:

(1) an alkali-soluble resin;
(2) a quinonediazide compound;
(3) an organic phosphoric compound; and
(4) at least one of a phenylenediamine compound and a derivative thereof, 2-amino-1-phenylethanol, N-phenyldiethanolamine, N-phenylethanolamine, N-ethyldiethanolamine, and N-ethylethanolamine.

(II) The resist composition according to item (I) described above, wherein the amount of the organic phosphoric compound (3) to be incorporated is from 0.001 to 10% by weight based on the sum of the solid content of the alkali-soluble resin (1) and the quinonediazide compound (2).

(III) The resist composition according to item (I) described above, wherein the amount of compound (4) to be incorporated is from 0.01 to 20% by weight based on the sum of the solid content of the alkali-soluble resin (1) and the quinonediazide compound (2).

(IV) A process for the formation of a fine pattern which comprises steps of:

(1) applying a resist to a substrate;
(2) irradiating the resist thus applied with active rays to form a latent image therein, and then developing the latent image to form a resist pattern; and
(3) etching the substrate with the resist thus patterned as a mask, that the resist composition defined in item (I) described above is used as the resist.

(V) The process for the formation of a fine pattern according to item (IV) described above, wherein the material to be etched is a film, oxide film or nitride film of Si, Ta, Ti, Cr, Mo, W, Sn, Ni, Ca or Al or ITO film vacuum-evaporated or sputtered on a silicon wafer, glass substrate or ceramic substrate.

The foregoing constitutions of the present invention can provide a resist composition which exhibits an excellent adhesion to a substrate during etching to give an enhanced accuracy in processing that allows the formation of a fine pattern regardless of the kind of the substrate used.

The foregoing prior art skills cannot provide a sufficient adhesion. No regard has been paid to prediction or suggestion of the enhancement of adhesion or the effect of a specific additive of enhancing the adhesion. Rather, the amine compound as used herein has never been regarded as an adhesion aid. Accordingly, it has been difficult even for those skilled in the art to predict the adhesion enhancing effect exerted by the simultaneous addition of the organic phosphoric compound and amine compound disclosed herein or the effect of the amine compound of enhancing the adhesion. In other words, the present invention can provide an effect which cannot be expected from the past knowledge.

BRIEF DESCRIPTION OF THE DRAWING

By way of example and to make the description more clear, reference is made to the accompanying drawing in which:

Figure is a graph illustrating the relationship between the etching time and one side etch amount (undercut amount) in etching tests effected in Examples 19 to 21 with a hydrochloric acid/ferric chloride system as an etchant.

DETAILED DESCRIPTION OF THE INVENTION

The present invention will be further described hereinafter.

As the alkali-soluble resin there may be used a novolak resin, a vinylphenol resin, N-(hydroxyphenyl)-maleimide copolymer, styrene-maleic anhydride copolymer, or a methacrylic or acrylic resin containing carboxyl group, sulfonyl group or phosphonic group. Examples of the alkali-soluble phenol resin include a novolak or resol resin which is a phenol/formaldehyde condensate as described in H. P. Press, "Synthetic Resin in Coatings", Chapter 5, Noyes Development Corporation, 1965, Pear River, N.Y. The novolak resin can be obtained by allowing a phenol such as phenol and p-chlorophenol, a cresol such as o-cresol, p-cresol and m-cresol or a xylenol such as 2,3-dimethylphenol, 2,4-dimethylphenol, 3,4-dimethylphenol and 3,5-dimethylphenol, singly or in combination, to undergo addition polymerization with an aldehyde such as formaldehyde, paraformaldehyde, acetaldehyde and furfural in an amount of from 0.6 to 1 mol per mol of the phenol in the presence of an acid catalyst. As such an acid catalyst there may be normally used hydrochloric acid, sulfuric acid, formic acid, oxalic acid, acetic acid or the like. The thus obtained novolak resin having a molecular weight of from 1,000 to 50,000 exhibits an alkali solubility and thus can be used herein.

The photosensitive material to be used herein is a compound containing a naphthoquinonediazide group as a photosensitive group in its molecule and acts as a dissolution inhibitor in the constituents of the photosensitive composition. Examples of such a compound include polyhydroxybenzophenones such as 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,3,4,3',4',5'-hexahydroxybenzophenone, a mixture of completely-substituted and partly-substituted products of esterification product of a polyhydroxyphenyl alkyl ketone, bis (polyhydroxyphenyl) alkane, polyhydroxybenzoic ester, bis (polyhydroxybenzoyl) alkane or bis(polyhydroxybenzoyl) aryl with 1,2-naphthoquinonediazide-5(and/or -4)sulfonyl chloride, a mixture of completely-substituted and partly-substituted products of esterification product of a polyhydroxyspiroindane compound with the foregoing sulfonyl chloride as disclosed in JP-A-64-76047, and a triphenylmethane polyhydroxy compound as disclosed in JP-A-1-189644. Further examples of polyhydroxy compounds include those disclosed in JP-A-4-274243. Of course, the present invention is not limited to these exemplified compounds. Many compounds proposed in these and other references can be used. These naphthoquinonediazide compounds may be used singly or in combination. The present invention is not limited to a specific combination of these naphthoquinonediazide compounds. The photosensitive material may be used generally in an amount of from 5 to 100 parts by weight, preferably from 5 to 60 parts by weight based on 100 parts by weight of the alkali-soluble resin. If the amount of the photosensitive material is less than 5 parts by weight, there is a possibility that a sufficient effect of inhibiting dissolution cannot be obtained, causing large reduction of the layer thickness on the unexposed area at development and hence causing a drop in the remaining layer rate. On the contrary, if it exceeds 100 parts by weight, there is a danger that the photosensitive material cannot be completely dissolved in the solvent, or, even if it can be dissolved in the solvent, instability factors such as deposition of photosensitive material, i.e., recrystallization of photosensitive material, present, and are undesirable for the maintenance of the original performance.

A higher accuracy in the processing of a fine pattern can be attained by adding, besides the above-described components, at least one of an organic phosphoric compound and a derivative thereof as an adhesion improver and a compound having an effect of accelerating the enhancement of the adhesion of the organic phosphoric compound, i.e., at least one selected from the group consisting of a phenylenediamine compound and a derivative thereof, 2-amino-1-phenylethanol, N-phenyldiethanolamine, N-phenylethanolamine, N-ethyldiethanolamine, and N-ethylethanolamine.

Specific examples of the foregoing organic phosphoric compound include $CH_3P(O)(OH)_2$, $C_6H_5P(O)(OH)_2$, $C_6H_5OP(O)(OH)_2$, $4-ClC_6H_4P(O)(OH)_2$, $4-CH_3OC_6H_4P(O)(OH)_2$, $3-NO_2C_6H_4P(O)(OH)_2$, $(C_6H_5)_2CHP(O)(OH)_2$, $C_4H_7P(O)(OH)_2$, $C_6H_{11}P(OH)_2$, $C_8H_{17}P(O)(OH)_2$, $(CH_3)_2P(O)(OH)H$, $(C_6H_5)_2PH$, $(C_6H_5)_2P(OH)$, $C_6H_5P(O)(OH)H$, $(C_6H_5O)_2P(O)OH$, $(C_6H_5)_2PH$, $(C_6H_5)P(O)H$, and $(C_6H_5)_2P(O)OH$.

The organic phosphoric compound may be normally used in an amount of from 0.001 to 10% by weight, preferably from 0.005 to 5% by weight based on 100% by weight of the sum of the solid content of the alkali-soluble resin and the naphthoquinonediazide compound. Even if the amount of the organic phosphoric compound is less than 0.001% by weight, the desired effect can be exerted depending on the kind of the organic phosphoric compound added. However, this effect is not necessarily sufficient for all kinds of substrates and has the selectivity of substrate. On the contrary, if it exceeds 10% by weight, the effect of the addition can not realize the performance expected and does not compensate for the large amount of addition, or the resulting resist composition may have a large tendency of lowering the stability at a solution state to thereby cause recrystalization etc. In this sense, the addition of the organic phosphoric compound in an amount greater than necessity has no great significance but may exert a reduced effect.

Further, if the organic phosphoric compound is added, the alkali solubility becomes remarkably great according to the added amount of the organic phosphoric compound, resulting in some undesirable phenomena such as extreme rise in the sensitivity of the resist and rise in the reduction of the layer thickness on the unexposed area causing the reduction of the remaining layer rate. Accordingly, the addition of the organic phosphoric compound in a large amount is not desirable. The rise in the sensitivity of the resist by the addition of the organic phosphoric compound can be coped with by adjusting the solubility of the novolak resin used to an appropriate value, to thereby obtain a sensitivity falling within the appropriate range. However, it is not necessarily easy even for one skilled in the art to find preferable amount of these compounds. The addition of the amine compound as a fourth component further complicates the process of balancing these components.

The amount of the amine compound to be added in combination with the organic phosphoric compound is normally from 0.01 to 20% by weight, preferably from 0.05 to 10% by weight based on 100% by weight of the sum of the solid content of the alkali-soluble resin and the naphthoquinonediazide compound. If the amount of the amine compound is less than 0.01% by weight, there is a possibility that the effect developed by the addition of the amine compound is too small to accelerate the enhancement of the adhesion. This may make little or no difference from the effect developed by the single use of the organic phosphoric compound. On the contrary, if it exceeds 20% by weight, there is a possibility that the stability of the composition in the form of solution is reduced to cause recrystallization, the resulting effect does not correspond to the added amount of the amine compound, or the sensitivity is lowered. The addition of an appropriate amount of the amine compound exerts an effect of accelerating the enhancement of the adhesion of the organic phosphoric compound to the substrate, but the mechanism of this effect is not yet made clear.

Examples of the amine compound effective for the acceleration of the adhesion of the organic phosphoric compound include amine compounds such as N-phenylethanolamine, N-phenyldiethanolamine, 2-amino-1-phenylethanol, N-ethyldiethanolamine and N-ethylethanolamine. Examples of the phenylenediamine compound and a derivative thereof include an alkyl- or ary-substituted phenylenediamine compound such as 2,5-dimethyl-1,4-phenylenediamine, 4,5-dimethyl-1,2-phenylenediamine, 2,3,5,6-tetramethyl-1,4-phenylenediamine, 2,4,6-trimethyl-1,3-phenylenediamine, N-phenyl-1,4-phenylenediamine and N-phenyl-1,2-phenylenediamine. Furthermore, examples thereof include isomers of an unsubstitued phenylenediamine compound, a phenylenediamine compound having a nitro group, a chlorine atom, a phenyl group substituted with an alkyl group having 1 to 3 carbon atoms, an unsubstituted phenyl group, or an amino group substituted with an alkyl group having 1 to 3 carbon atoms such as N,N'-diphenyl-1,4-phenylenediamine, N-methyl-1,2-phenylenediamine, 4-chloro-1,2-phenylenediamine, 2-nitro-1,4-phenylenediamine, 3-nitro-1,2-phenylenediamine, and 4-nitro-1,2-phenylenediamine.

As the solvents to be used in the resist composition of the present invention there may be used most organic solvents used in conventional naphthoquinonediazide positive-working resists. Examples of these organic solvents include glycol ethers such as methyl cellosolve, ethyl cellosolve, propyl cellosolve, propylene glycol monomethyl ether, propylene glycol monoethyl ether and propylene glycol propyl ether, acetylation products thereof such as methyl cellosolve acetate, ethyl cellosolve acetate, propyl cellosolve acetate, propylene glycol monomethyl ether acetate, propylene glycol monoethyl ether acetate and propylene glycol propyl ether acetate, and propionates of the foregoing ethers such as ethylene glycol monoethyl ether propionate. Examples of ester acetate solvents include amyl acetate, butyl acetate, propyl acetate, methyl acetate, and ethyl acetate. Examples of ketone solvents include methyl isobutyl ketone, methyl ethyl ketone, cyclohexanone, and γ-butyrolactone. Other examples of the solvents employable herein include polar solvents such as dimethylformamide, dimethylacetamide, dimethyl sulfoxide and N-methylpyrrolidone, ethyl lactate, methyl pyruvate, ethyl pyruvate, ethylethoxy propionate, and methylmethoxy propionate. These solvents may be used singly or in admixture. However, some combinations of solvents cannot provide the formation of desired coating layer depending on the coating method. Since one skilled in the art can easily know the optimum coating method by conducting a simple coating test, such undesirable combinations can be avoided.

The composition according to the present invention may comprise various additives such as surface active agent, modified resin and plasticizer, low molecular polymers or low molecular compounds incorporated therein besides these three components to improve the coatability thereof or the properties of the resulting coating film. Further, the composition according to the present invention may comprise an appropriate dye or colorant incorporated therein for the purpose of enhancing the visibility thereof or inhibiting the occurrence of standing wave. Moreover, the composition according to the present invention may comprise a low molecular compound or low molecular resin component having a sensitizing effect incorporated therein to raise the sensitivity thereof. The amount of these auxiliary additives to be incorporated should be limited to such a value that the effect of the compound added as a fourth or fifth component is not impaired. It is not necessarily difficult to know the upper limit of the added amount of these auxiliary additives.

The surface active agent normally acts to inhibit striation generated during coating, enhance the leveling of the coated surface or improve the adaptation of the resist composition to the roll during roller coating. Such a surface active agent can be classified into four types of surface active agents, i.e., cationic surface active agent, anionic surface active agent, amphoteric surface active agent and nonionic surface active agent. Preferred among these surface active agents is nonionic surface active agent. Specific examples of such a nonionic surface active agent include ether type surface active agents such as block polymer having alkyl, alkylallylpolyoxy ethylene ether, polyoxyethylene polyoxyprpyl alkyl ether or polyoxypropylene as a lipophilic group, ether ester type surface active agents such as polyoxyethylene ether of glycerin ester, polyoxyethylene ether of sorbitan ester and polyoxyethylene ether of sorbitol ester, ester type surface active agents such as polyethylene glycol fatty acid ester, glycerin ester, polyglycerin ester, sorbitan ester and propylene glycol ester, and nitrogen-containing surface active agents such as fatty acid alkanolamide, polyoxyethylene fatty acid amide, polyoxyethylene alkylamine and amine oxide. These surface active agents are commercially available in abundance. Besides these types of surface active agents, there is a fluorinic surface active agent. Similarly to the foregoing surface active agents, such a fluorinic surface active agent can be classified into four types of surface active agents. A nonionic fluorinic surface active agent is preferably used. Examples of such a nonionic fluorinic surface active agent include a straight-chain fluorinic surface active agent having a perfluoroalkyl group or fluoroalkyl group. Further examples of surface active agents include a polysiloxane surface active agent having silicon. The surface active agents employable herein can be selected from these surface active agents. The amount of the surface active agent to be incorporated may be as small as not more than 2% by weight to exert the desired effect. The addition of the surface active agent in an amount greater than necessary can impair the properties of the entire composition.

The resist composition of the present invention may comprise a sensitizer incorporated therein to enhance the sensitivity thereof. Examples of such a sensitizer include triazole compounds, indazole compounds and tetrazole compounds as disclosed in JP-A-58-37641, mercapto-substituted thiadiazole compounds as disclosed in JP-A-61-172139, compounds as disclosed in JP-A-58-149042, and compounds as disclosed in JP-A-58-182633. Such a sensitizer may be normally used in an amount of from about 0.1 to 20% by weight based on the weight of the novolak resin used. Further, from the standpoint of the rise in the sensitivity of the composition, an alkali-soluble low molecular compound which is a so-called dissolution accelerator for raising the dissolution rate of the entire system may be used. Examples of the alkali-soluble low molecular compound suitable for this purpose include carboxylic compounds and polyhydroxy compounds. The amount of such a dissolution accelerator, if any, is normally from about 1 to 40% by weight based on the weight of the novolak resin used.

The amount of a dye, if any, is normally from about 0.1 to 5% by weight. In order to maximize the effect of the dye, a compound which has an appropriate absorption in the wavelength range of the exposing light and can be dissolved in the solvent in a necessary amount may be selected. A dye having an alkali solubility is preferred. However, this requirement is not necessarily needed. Actually, many alkali-insoluble dyes may be used in such an amount that the properties of the resist composition cannot be impaired.

The resist composition thus obtained can be used to form a desired pattern. The resist composition of the present invention can be used in the form of coating film. The formation of the coating film can be accomplished by various methods such as bar coating method using various roll coater bars comprising a spinner roll for a rotary coating process. However, depending on the kind of the solvent used, there are some cases where a flat glossy coating film cannot be obtained. Therefore, a suitable solvent may be properly selected depending on the coating method.

The substrate (material to be etched) employable herein is a film of Si, Ta, Ti, Cr, Mo, W, Sn, Ni, Ca or Al or oxide or nitride thereof or ITO film vacuum-evaporated or sputtered on a silicon wafer, glass substrate or ceramic substrate. A coating having a dry thickness of from 0.5 µm to several micrometers is then formed on such a substrate by the foregoing method. The substrate having a resist layer formed thereon is then imagewise irradiated with light from a stepper projection aligner or an exposure apparatus having a light source such as ultrahigh pressure mercury vapor lamp, high pressure mercury vapor lamp, low pressure mercury vapor lamp, arc lamp and xenon lamp through a predetermined pattern to form a latent image thereon. The substrate having a latent image formed thereon is then developed with a predetermined developer. As such a developer there may be used an organic or inorganic developer. Examples of such an organic developer include an aqueous solution of tetramethyl ammonium hydroxide (TMAH) having a concentration of from about 0.5 to 5% by weight. Examples of the inorganic developer include an aqueous solution of caustic soda, caustic potassium, sodium silicate, etc. having a concentration of from about 0.1 to 5% by weight. The sample substrate thus exposed may be dipped in such a developer or showered with such a developer or brought into contact with such a developer with stirring by a paddle agitator for a predetermined period of time, and then washed with water to obtain a desired resist pattern.

With the resist pattern thus obtained as an etching mask, the substrate is then subjected to wet etching with an appropriate etchant or dry etching by plasma or the like. In the case where wet etching is effected, post-baking is preferably effected to inhibit undercutting by the penetration of an etchant. In general, this post-baking is conducted at a temperature of from about 110° C. to 140° C., but the present invention is not limited thereto. Examples of the etchant employable herein include ferric chloride/hydrochloric acid system etchant, hydrochloric acid/nitric acid system etchant, and HBr system etchant. Many etchants have been developed and used. The substrate thus etched is then subjected to wet peeling with an aqueous solution of an alkali such as NaOH and KOH or an organic solvent stripping agent or dry ashing using plasma or the like to remove the resist therefrom. Through such a series of treatments, a desired circuit pattern can be formed.

The present invention will be further described in the following examples, but the present invention should not be construed as being limited thereto.

Preparation of Resist to be Evaluated

For the comparison of the effect of additives, a resist having the following composition was prepared as a basic formulation.

The resist thus prepared is referred to as Resist A. Resist A comprises a resin, a photosensitive material and a solvent, free of additives.

| | |
|---|---|
| Total solid content concentration | 30% |
| Novolak (resin solid content) (m-cresol/p-cresol ratio = 50/50 by weight; molecular weight = 12,000) | 21.6% by weight |
| Photosensitive material (photosensitive material/(photosensitive material + novolak) = 0.28 2,3,4-Trihydroxybenzophenone, ester 1,2-naphthoquinonediazide-5-sulfonate | 8.4% by weight |
| Solvent   ECA (ethylene glycol monoethyl ether acetate) | 70.0% by weight |

To Resist A having the foregoing formulation were then added additives in the following proportions to prepare a sample which was then evaluated for adhesion.

Additive 1: Organic phosphoric acid in an amount of 1% by weight based on the total amount of novolak and photosensitive material Additive 2: Amine compound in an amount of 3% by weight based on the total amount of novolak and photosensitive material The solution thus prepared was then filtered through a filter having a pore size of 0.2 µm to obtain a coating solution.

Evaluation Method

1. Image Formation

A 100-mm square cut glass substrate having sputtered thereon an ITO layer having a thickness of about 2,300 Å was washed and dried by a predetermined method. The glass substrate thus treated was then subjected to heat treatment in a 200° C. clean oven for 15 minutes so that it was dehydrated. The substrate was then allowed to cool. The substrate was then coated with the resist previously prepared by means of a spin coater. In order to pre-bake the substrate, the substrate was subjected to heat treatment over an absorption type hot plate at a temperature of 110° C. for 90 seconds. It is necessary that the number of revolutions be previously checked each for various samples to control the thickness of the coating film to 1.5±0.01 µm. The ITO substrate thus treated was then exposed to a broad ultraviolet light of ghi-mix from an ultrahigh pressure mercury vapor lamp through a test reticle marked with a predetermined mask pattern using a mask aligner PLA-501F available from Canon Inc. in a proximity mode. Paying attention to 20-µm pattern on the various samples, the exposure Eopt by which a line-and-space can be obtained was confirmed. The terminology "Eopt" means an optimum exposure amount which provides a resist pattern having lines and spaces having the same width by exposure effected through a mask pattern having lines and spaces having the same width. These samples were each exposed accordingly. The substrates thus exposed were each developed with a 0.75% aqueous solution of caustic soda as a developer at a temperature of 23° C. for 60 seconds while being dipped in the developer with mild oscillation. After a predetermined period of time, these samples were washed with flowing water in deionized water for 30 seconds. Water droplets were then blown off by an $N_2$ gas gun to obtain a desired resist pattern.

2. Etching Test

The ITO plate thus treated was then subjected to post-baking treatment over a heating plate which had been kept to a temperature of 120° C. by an absorption type hot plate for 240 seconds.

The ITO substrate thus post-baked was then subjected to wet etching. For the evaluation of the resist composition, the following three etchants were used.

1. 36% HCl: $FeCl_2:H_2O$=8:1:1 (by weight)
2. 47% aqueous solution of HBr
3. 36% $HCl:HNO_3:H_2O$=140 (l): 5 kg: 50 (l)

The etching was effected at a temperature of 40°±1° C. by an oscillation dip method. Prior to the etching test, the just etch time for ITO substrate was determined with each etchant. The etching time was then determined according to the just etch time. The substrate was etched over five etching times, i.e., just etch time, double, triple, quadruple and octuple. The purpose of this process is to consider the overetching time commonly used in the production line, which doubles or triples the just etch time, and the forced evaluation by largely excessive overetching for comparison. The substrate which had been etched for the foregoing predetermined etching time was thoroughly washed with flowing water. Water droplets were then blown off the substrate by $N_2$ gas.

3. Measurement of Size

The substrate thus etched was then measured for size of resist pattern by means of a manual size measuring apparatus. The resist was then dissolved away with a 5% aqueous solution of caustic soda as a stripping agent to obtain an ITO pattern. The size of the ITO pattern thus obtained was measured in the same manner as the resist pattern. The undercut amount of the ITO layer was estimated from the difference between the resist size and the ITO size. By comparing these values, the effect of the various additives of enhancing the adhesion of the resist were compared. In general, properties obtained in the vicinity of just etch have so small a difference as to be compared. Therefore, comparison was conducted in the range of overetching.

EXAMPLES 1 TO 18 and COMPARATIVE EXAMPLES A TO C

Samples were prepared by adding the additives set forth in Table 1 to Resist A in the foregoing predetermined amounts. These samples were then evaluated. For comparison, a basic resist free of additives (Comparative Example A), a sample comprising only phenylphosphonic acid as a representative organic phosphoric compound (Comparative Example B) and a sample comprising N-phenyldiethanolamine as an amine compound (Comparative Example C) were prepared. The results are set forth in Table 1.

As a result, the sample of Comparative Example A, which is free of additives, exhibited the worst adhesion. It was found that the addition of an organic phosphoric compound (Comparative Example B) or the addition of an amine compound (Comparative Example C) enhanced the adhesion of the resist composition, but did not exhibit satisfactory adhesion. On the other hand, as shown in Examples 1 to 18, the addition of an amine compound in addition to the organic phosphoric compound provided a remarkable enhancement of adhesion as compared with the single addition of the organic phosphoric compound. Thus, the addition of an amine compound exerted an effect of accelerating the enhancement of adhesion.

TABLE 1

| Example No. | Organic Phosphoric Compound | | Amine Compound | Undercut Amount at One Side (by different etchant) (µm) | | |
|---|---|---|---|---|---|---|
| | | | | $FeCl_3$/HCl | $HCl/HNO_3$ | HBr |
| 1 | $C_6H_5P(O)(OH)_2$ | (PPA) | DMPDA-1 | 3.23 | 5.29 | 2.19 |
| 2 | $CH_3P(O)(OH)_2$ | (MPA) | DMPDA-1 | 3.30 | — | — |
| 3 | $C_6H_5OP(O)(OH)_2$ | (BPA) | DMPDA-1 | 3.12 | — | — |
| 4 | $C_6H_5P(O)(OH)_2$ | (PPA) | DMPDA-2 | 4.27 | 6.01 | 3.51 |
| 5 | $C_6H_5OP(O)(OH)_2$ | (BPA) | DMPPA-2 | 4.20 | — | — |
| 6 | $C_6H_5P(O)(OH)_2$ | (PPA) | NPPDA-1 | 4.19 | 5.87 | 3.49 |
| 7 | $CH_3P(O)(OH)_2$ | (MPA) | NPPDA-1 | 4.08 | — | — |
| 8 | $(C_6H_5)_2P(O)OH$ | (DPPA) | NPPDA-1 | 4.22 | — | — |
| 9 | $C_6H_5P(O)(OH)_2$ | (PPA) | NPPDA-2 | 3.89 | 5.82 | 2.53 |
| 10 | $(C_6H_5)_2P(O)OH$ | (DPPA) | NPPDA-2 | 4.07 | — | — |

TABLE 1-continued

| Example No. | Organic Phosphoric Compound | | Amine Compound | Undercut Amount at One Side (by different etchant) (μm) | | |
|---|---|---|---|---|---|---|
| | | | | FeCl$_3$/HCl | HCl/HNO$_3$ | HBr |
| 11 | CH$_3$P(O)(OH)$_2$ | (MPA) | NPPDA-2 | 4.34 | — | — |
| 12 | C$_6$H$_5$P(O)(OH)$_2$ | (PPA) | NPDEA | 2.33 | 5.15 | 1.37 |
| 13 | CH$_3$P(O)(OH)$_2$ | (MPA) | NPDEA | 2.51 | 5.12 | 1.66 |
| 14 | (C$_6$H$_5$O)$_2$P(O)OH | (DPP) | NPDEA | 2.88 | 5.22 | 1.82 |
| 15 | (C$_6$H$_5$)$_2$P(O)OH | (DPPA) | NPDEA | 2.57 | 5.33 | 1.20 |
| 16 | (C$_6$H$_5$)$_2$CHP(O)(OH)$_2$ | (DPMPA) | NPDEA | 2.62 | 5.09 | 1.59 |
| 17 | C$_6$H$_5$P(O)(OH)$_2$ | (PPA) | NPEA | 3.05 | 5.92 | 3.06 |
| 18 | (C$_6$H$_5$)$_2$CHP(O)(OH)$_2$ | (DPMPA) | NPEA | 3.55 | — | — |
| Comparative Example A | None | | None | 5.71 | Resist peeled | 4.68 |
| Comparative Example B | C$_6$H$_5$P(O)(OH)$_2$ | (PPA) | None | 4.70 | 6.27 | 3.87 |
| Comparative Example C | None | | NPDEA | 5.02 | 7.25 | 4.33 |

Note)
ITO thickness: 2,300 Å; Etching time measured: just etch × 8; Pattern measured: 20 μm
DMPDA-1: 2,5-Dimethyl-1,4-phenylenediamine
DMPDA-2: 4,5-Dimethyl-1,2-phenylenediamine
NPPDA-1: N-phenyl-1,4-phenylenediamine
NPPDA-2: N-phenyl-1,2-phenylenediamine
NPDEA: N-phenyldiethanolamine
NPEA: N-phenylethanolamine

EXAMPLES 19 TO 21

The system of Example 12 was used to determine the effect exerted by the addition of an amine compound. Resists having the formulation set forth in Table 2 were prepared.

TABLE 2

| Example No. | Organic Phosphoric Compound | Amine Compound |
|---|---|---|
| 19 | C$_6$H$_5$P(O)(OH)$_2$ (PPA) 1% by weight | N-phenyldiethanolamine (NPDEA) 1% by weight |
| 20 | C$_6$H$_5$P(O)(OH)$_2$ (PPA) 1% by weight | N-phenyldiethanolamine (NPDEA) 2% by weight |
| 21 | C$_6$H$_5$P(O)(OH)$_2$ (PPA) 1% by weight | N-phenyldiethanolamine (NPDEA) 10% by weight |

An etching test was effected in accordance with the procedure described in the foregoing examples. As an etchant there was used a hydrochloric acid/ferric chloride system. The results are shown in Figure, in which the plots, —□— —▲—, —○—, —△—, ---⊞--- and ---◪--- indicate the results of Comparative Example A, Comparative Example B, Example 19, Example 20, Example 12, and Example 21, respectively.

As the added amount of NPDEA increased with the added amount of PPA fixed, the resist composition showed a remarkable rise in adhesion, as compared with the comparative examples. It can be seen that the amine compound added in addition to the organic phosphoric compound exerts an effect of accelerating the enhancement of adhesion.

COMPARATIVE EXPERIMENT 1

The procedure of Example 1 was followed to evaluate the adhesion of the resist except that the added amount of phenylphosphonic acid (PPA) was 0.0005% by weight. As a result, with the hydrochloric acid/ferric chloride system etchant, the one side etch amount was 5.6 μm. The degree of side etching was almost the same as that of Comparative Example A. Thus, no effect of enhancing the adhesion was recognized. In other words, the addition of an organic phosphoric compound in an amount less than that disclosed herein cannot exert a desired effect even if an amine compound having an acceleration effect is added.

On the contrary, when the organic phosphoric compound was added in an amount of 12% by weight, no problems arose in dissolution. However, when the sample was exposed and developed to determine sensitivity, it showed a remarkably high sensitivity. Further, the reduction in the layer thickness on the unexposed area was great, and the remaining layer rate was as small as not more than 50%, giving practical problems. In order to adjust the sensitivity to an appropriate value, a novolak resin having an extremely low dissolution rate needs to be incorporated in the system. However, such a novolak resin gave a high solution viscosity, making it remarkably difficult to handle the resist composition in a practical use.

COMPARATIVE EXPERIMENT 2

Samples were prepared in the same manner as in Examples 4, 6, 12 and 17 except that the added amount of the amine compound was about 0.001%. These samples were examined for adhesion. The measurements were then compared with that of Comparative Example B. As a result, it was found that the addition of the amine compound in a small amount gave almost the same results as the absence of amine compound. Thus, no expected effects were obtained. This demonstrates that the use of such an amine compound in an appropriate amount gives a useful resist composition which can be easily handled.

| No. | Compound (Added Amount) | Side Etch Amount (μm) |
|---|---|---|
| 22 | Phenylphosphonic acid (1%) 4,5-Dimethyl-1,2-phenylenediamine (0.001%) | 4.62 |

-continued

| No. | Compound (Added Amount) | Side Etch Amount (μm) |
|---|---|---|
| 23 | Phenylphosphonic acid (1%) N-phenyl-1,4-phenylenediamine (0.001%) | 4.75 |
| 24 | Phenylphosphonic acid (1%) N-phenyl-diethanolamine (0.001%) | 4.58 |
| 25 | Phenylphosphonic acid (1%) N-phenylethanolamine (0.001%) | 4.66 |
| Comparative Example B | As described above | 4.70 |

COMPARATIVE EXPERIMENT 3

The procedure of Example 1 was followed except that the amine compound was added in an amount of 25% by weight. The amine compound was not completely dissolved in the system at room temperature. Then, the system was shaken over a hot water of about 60° C. so that the amine compound was dissolved. However, the solution underwent precipitation with time, showing that the system was unstable. Accordingly, the addition of the amine compound in excess amount is undesirable since it deteriorates the stability of the solution itself, though depending on the kind of additives.

As shown in the foregoing examples, the present invention can provide a remarkable enhancement of adhesion. Accordingly, the dimensional variation due to the nonuniform etching conditions in an overetching process can be minimized.

The resist composition of the present invention exhibits an enhanced adhesion to a metallic substrate, and improves processing properties and accuracy in processing. Thus, a middle accuracy photoetching requiring the reduction of line width in circuit pattern is made possible. In other words, the enhancement of the adhesion to the substrate can minimize the fluctuation of the finished dimension on the peripheral area and central area of a large-sized substrate due to overetching. Further, the enhancement of accuracy in processing also contributes to the enhancement of yield. In the wet etching process, the amount side-etched is so small that the intensitity of the etchant used can be strong, making it possible to reduce the required etching time. By improving the etching process, the through-put can be enhanced, too.

While the invention has been described in detail and with reference to specific embodiments thereof, it will be apparent to one skilled in the art that various changes and modifications can be made therein without departing from the spirit and scope thereof.

What is claimed is:

1. A positive-working photosensitive composition comprising, in admixture:

(1) an alkali-soluble resin;

(2) a quinonediazide compound;

and, as adhesion aids:

(3) an organic phosphoric compound; and (4) at least one of a phenylenediamine compound, 2-amino-1-phenylethanol, N-phenyldiethanolamine, N-phenylethanolamine, N-ethyldiethanolamine, and N-ethylethanolamine;

wherein the amount of the organic phosphoric compound (3) is from 0.001 to 10% by weight based on the sum of the solid content of the alkali-soluble resin (1) and the quinonediazide compound (2) and the amount of compound (4) is from 0.01 to 20% by weight based on the sum of the solid content of the alkali-soluble resin (1) and the quinonediazide compound (2).

2. A process for the formation of a fine pattern which comprises steps of:

(1) applying a resist to a substrate;

(2) irradiating the resist thus applied with active rays to form a latent image therein, and then developing the latent image to form a resist pattern; and (3) etching the substrate with the resist thus patterned as a mask, wherein the resist is a positive-working photosensitive composition comprising, in admixture (1) an alkali-soluble resin;

(2) a quinonediazide compound;

(3) an organic phosphoric compound; and (4) at least one of a phenylenediamine compound 2-amino-1-phenylethanol, N-phenyldiethanolamine, N-phenylethanolamine, N-ethyldiethanolamine, and N-ethylethanolamine.

3. The process for the formation of a fine pattern according to claim 2, wherein the substrate to be etched is a film, oxide film or nitride film of Si, Ta, Ti, Cr, Mo, W, Sn, Ni, Ca or Al or ITO film vacuum-evaporated or sputtered on a silicon wafer, glass substrate or ceramic substrate.

* * * * *